United States Patent
Taniguchi et al.

(10) Patent No.: US 6,291,895 B1
(45) Date of Patent: Sep. 18, 2001

(54) METHOD OF FABRICATING SEMICONDUCTOR HAVING THROUGH HOLE

(75) Inventors: Fumihiko Taniguchi; Koji Honna; Yoshikazu Kumagaya, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/335,878

(22) Filed: Jun. 18, 1999

Related U.S. Application Data

(62) Division of application No. 09/123,450, filed on Jul. 28, 1998, now Pat. No. 5,953,592.

(30) Foreign Application Priority Data

Feb. 25, 1998 (JP) .................................................. 10-43589

(51) Int. Cl.[7] ............................. H01L 23/48; H01L 23/52
(52) U.S. Cl. ........................ 257/782; 257/783; 257/780; 257/738
(58) Field of Search ............................ 438/115, 118; 257/782, 783, 778, 779, 772, 666, 667, 738, 780

(56) References Cited

U.S. PATENT DOCUMENTS

| | | | |
|---|---|---|---|
| 4,483,067 | | 11/1984 | Parmentier ............................ 438/126 |
| 5,063,177 | | 11/1991 | Geller et al. ......................... 438/125 |
| 5,490,324 | | 2/1996 | Newman ............................... 438/118 |
| 5,602,059 | * | 2/1997 | Horiuchi et al. ..................... 257/782 |
| 5,612,576 | * | 3/1997 | Wilson et al. ....................... 257/666 |
| 5,683,942 | * | 11/1997 | Kata et al. .......................... 257/682 |
| 5,731,231 | | 3/1998 | Miyajima ............................. 438/123 |
| 5,737,191 | * | 4/1998 | Horiuchi et al. ..................... 257/783 |
| 5,746,390 | | 5/1998 | Berg et al. .......................... 438/125 |
| 5,753,535 | | 5/1998 | Ebihara ............................... 438/123 |
| 5,756,379 | | 5/1998 | Haghiri-Tehrani ................... 438/126 |
| 5,834,336 | | 10/1998 | Maheshwari et al. ............... 438/118 |
| 5,835,355 | * | 11/1998 | Dordi .................................. 257/688 |
| 5,874,784 | | 2/1999 | Aoki et al. .......................... 438/124 |
| 5,897,337 | * | 4/1999 | Kata et al. .......................... 438/114 |
| 5,950,908 | * | 9/1999 | Fujino et al. ........................ 257/782 |
| 5,973,404 | * | 10/1999 | Akram et al. ....................... 257/778 |
| 5,976,912 | * | 11/1999 | Fukotomi et al. .................... 438/110 |

FOREIGN PATENT DOCUMENTS 4-148554   5/1992   (JP) .

* cited by examiner

Primary Examiner—Mary Wilczewski
(74) Attorney, Agent, or Firm—Armstrong, Westerman, Hattori, McLeland & Naughton, LLP

(57) ABSTRACT

The semiconductor device includes a semiconductor chip, a tape for mounting the semiconductor chip thereto, an adhesive resin layer interposed between the semiconductor chip and the tape, and solder balls attached to the tape. The method of fabricating the semiconductor chip comprises the step of forming at least one hole in the tape, after fixing the semiconductor chip to the tape through the adhesive resin layer. Also, the TAB tape is made of polyimide having high water permeability.

5 Claims, 5 Drawing Sheets

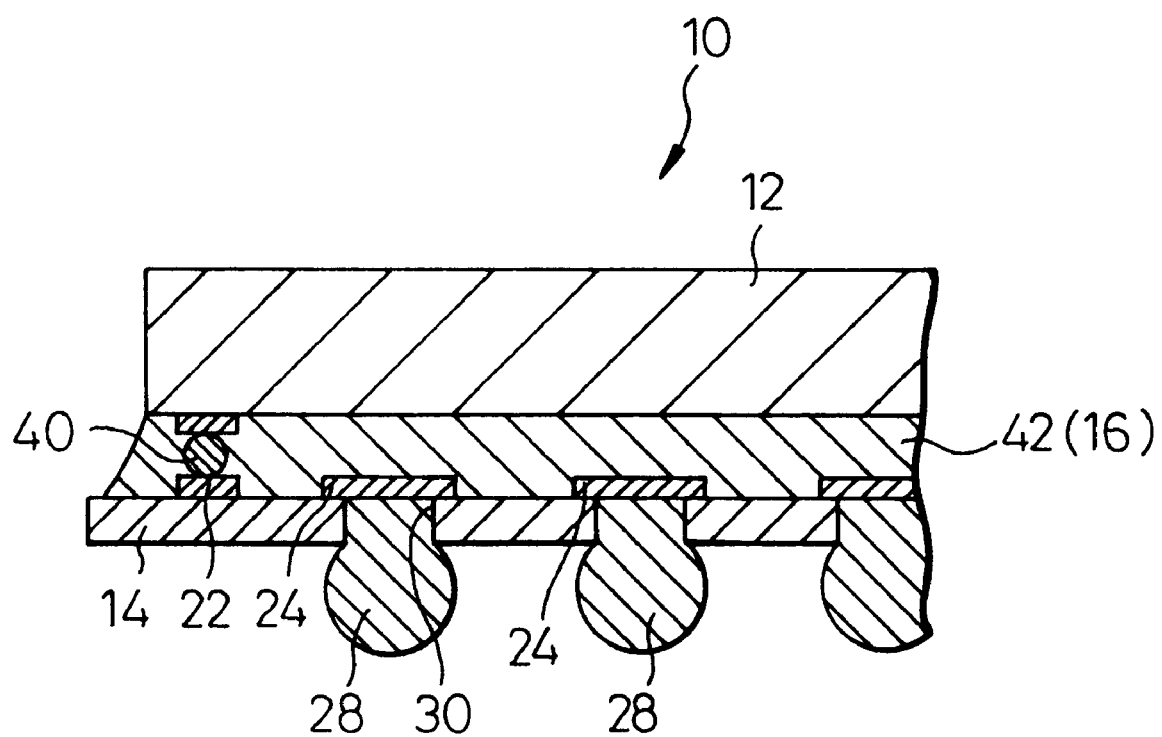

METHOD OF FABRICATING SEMICONDUCTOR HAVING THROUGH HOLE

This application is a division of prior application Ser. No. 09/123,450 filed Jul. 28, 1998, now U.S. Pat. No. 5,953,592.

BACKGROUND OF THE INVENTION

1. Field of the Invention

The present invention relates to a semiconductor device and to a method of fabricating the same. In particular, the present invention relates to a semiconductor device having a package structure of a BGA or a CSP type and to a method of fabricating such a semiconductor device.

2. Description of the Related Art

In recent years, with the increasing demand for small, light and thin electronic apparatuses, smaller, lighter, and thinner semiconductor devices are required. In order to satisfy this demand, semiconductor devices having package structures of the BGA and the CSP types have been developed.

A semiconductor device having a package structure of a BGA or a CSP type comprises a semiconductor chip, an FPC tape such as a TAB tape for mounting the semiconductor chip thereto and solder balls arranged on the TAB tape. The semiconductor chip is fixed to the TAB tape by a die bonding material. The TAB tape has bonding pads and ball pads, the bonding pads and the ball pads being interconnected in the TAB tape by a wiring pattern. The semiconductor chip is connected to the bonding pads of the TAB tape by wires.

The solder balls are arranged on the ball pads of the TAB tape and thus function as external electrodes. As a result, the semiconductor chip and the solder balls are electrically connected to each other by the TAB tape as an interposer. In the case where a semiconductor device of surface mount type having solder balls functioning as external terminals, such as a semiconductor device of BGA or CSP type, is mounted to a motherboard, the semiconductor device is, in general, heated in a solder reflowing equipment having an ambient temperature of about 250° C. to connect the melted solder balls to the electrode pads of the motherboard.

Also, it is conceivable to attach a buffer resin sheet to the TAB tape to reduce the stress arising due to the difference in the coefficient of thermal expansion between the semiconductor chip and the TAB tape, and to apply the die bonding material to the buffer resin sheet to thereby fix the semiconductor chip to the TAB tape.

In the semiconductor device in which the semiconductor chip is fixed on to the TAB tape by the die bonding material and sealed by the sealing resin, moisture is contained in the polyimide constituting the TAB tape, the sealing resin and the die bonding material. Especially, the polyimide making up the TAB tape is a material which easily absorbs moisture. Therefore, when the solder balls are reflowed to mount the semiconductor device to the motherboard, the moisture contained in the TAB tape, the sealing resin and the die bonding material is evaporated with the increase in temperature and the vapor causes cracking and/or bulging of the semiconductor device.

In order to solve this problem, a method has been proposed in which small holes are formed through the TAB tape before the semiconductor chip is mounted to the TAB tape, so that the moisture contained in the semiconductor device may be released through the small holes when the solder balls are reflowed after the semiconductor chip is mounted to the TAB tape. The cracking and bulging of the semiconductor device can be prevented by releasing the moisture contained in the semiconductor device.

However, if small holes are formed in the TAB tape in advance, the die bonding material between the semiconductor chip and the TAB tape may flow and may fill up the holes of the TAB tape at the time of heat treatment during the fabrication process of the semiconductor device, with the probable result that the holes fail to function as vapor escape holes. It is also possible that the die bonding material flows through holes of the TAB tape and contaminates the reverse side of the TAB tape or the jigs or tools to be used. In the case where the buffer resin sheet is attached to the TAB tape, on the other hand, the buffer resin sheet blocks the flow of the die bonding material, but the buffer resin sheet is melted and fills up the holes of the TAB tape, often leading to the failure of the holes to function as vapor escaping holes.

SUMMARY OF THE INVENTION

The object of the present invention is to provide a semiconductor device and a method of fabricating the same which can prevent cracking and bulging of the semiconductor device.

According to the present invention, there is provided a method of fabricating a semiconductor device comprising a semiconductor chip, a tape for mounting the semiconductor chip thereto, an adhesive resin layer interposed between the semiconductor chip and the tape and solder balls arranged on the tape, the method comprising the steps of fixing the semiconductor chip to the tape by the adhesive resin layer, and forming at least one hole in the tape after the step of fixing the semiconductor chip to the tape by the adhesive resin layer.

In this arrangement having at least one hole formed in the tape, the moisture contained in the semiconductor device is released through the at least one hole when the solder balls are reflowed, to thereby prevent cracking and bulging of the semiconductor device. Since the hole is formed after the step of fixing the semiconductor chip to the tape by the adhesive resin layer, the hole is not filled up with the adhesive resin layer which may flow at the time of heat treatment during the semiconductor fabrication process and thus effectively functions as a vapor escape hole.

Preferably, the method further includes the step of attaching the solder balls to the tape. The step of attaching solder balls to the tape is executed after the step of fixing the semiconductor chip to the tape by the adhesive resin layer and before the step of forming the hole.

Preferably, the hole is formed through the tape using a laser beam to such an extent as to reach the adhesive resin layer.

Preferably, the method further comprises the step of sealing the semiconductor chip with a sealing resin.

Preferably, the step of fixing the semiconductor chip to the tape by the adhesive resin layer includes the step of applying a die bonding material to the tape. As an alternative, the step of fixing the semiconductor chip to the tape by the adhesive resin layer includes the step of attaching a buffer material to the tape and the step of applying a die bonding material to the buffer material. As another alternative, the step of fixing the semiconductor chip to the tape by the adhesive resin layer includes the step of connecting the semiconductor chip to the tape by protruding electrodes and the step of filling an under-filling material between the semiconductor chip and the tape.

A semiconductor device according to another aspect of the present invention comprises a semiconductor chip, a tape for mounting the semiconductor chip thereto, an adhesive resin layer interposed between the semiconductor chip and the tape and solder balls arranged on the tape and is characterized in that the tape and the adhesive resin layer have at least one hole extending through the tape and reaching the adhesive resin layer.

In this arrangement, the tape and the adhesive resin layer having at least one hole formed through the tape and reaching the adhesive resin layer are produced according to the method of fabricating the semiconductor device described above and have the same function and effect as the corresponding ones described above. Specifically, when the solder balls are rendered to reflow, the moisture contained in the semiconductor device is released through the hole to thereby prevent cracking and bulging of the semiconductor device. At the same time, the hole is not filled up with the adhesive resin layer which flows at the time of the heat treatment during the semiconductor fabrication process and therefore effectively operates as a vapor escape hole.

Preferably, the semiconductor device comprises a sealing resin for sealing the semiconductor chip, and the adhesive resin layer is made of a die bonding material for fixing the semiconductor chip to the tape. As an alternative, the semiconductor device comprises a sealing resin for sealing the semiconductor chip, and the adhesive resin layer includes a buffer material for reducing the stress arising due to the difference in the coefficient of thermal expansion between the semiconductor chip and the tape and a die bonding material for fixing the semiconductor chip to the tape by the buffer. As another alternative, the semiconductor chip is connected to the tape by protruding electrodes, and the adhesive resin layer is made of an under-filling material filled between the semiconductor chip and the tape.

Preferably, the tape is a FPC tape such as a TAB tape.

Further, the semiconductor device according to the present invention comprises a semiconductor chip, a tape for mounting the semiconductor chip thereto, an adhesive resin layer interposed between the semiconductor chip and the tape, and solder balls arranged on the tape, characterized in that the tape is made of a material having high water permeability to prevent package cracking and bulging which otherwise might be caused when the solder balls are reflowed after the semiconductor device absorbs moisture.

In this arrangement, since the tape is made of a material having high water permeability, the moisture contained in the semiconductor device escapes from the tape thereby to prevent the semiconductor device from developing cracking or bulging at the time of solder ball reflow, similar to the above-mentioned case where the tape has at least one hole.

Preferably, the tape is made of a resin having water permeability of 10 (g/m$^2$·24H) or more.

BRIEF DESCRIPTION OF THE DRAWINGS

The present invention will become more apparent from the following description of the preferred embodiments, with reference to the accompanying drawings, in which:

FIG. 9 is a cross-sectional view of the semiconductor device according to the sixth embodiment of the invention.

DESCRIPTION OF THE PREFERRED EMBODIMENTS

Figure 1:
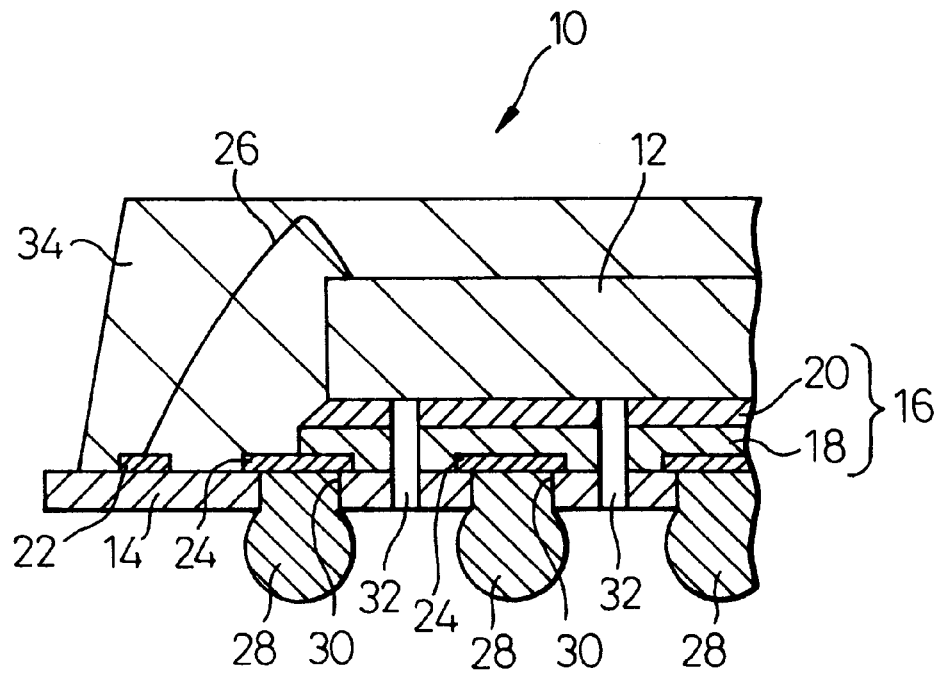
FIG. 1 is a cross-sectional view of a semiconductor device according to the first embodiment of the present invention.
Figure 2:
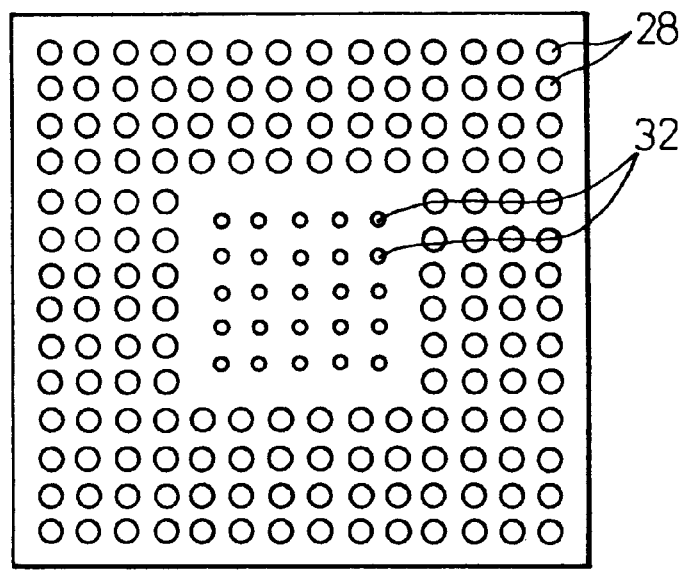
FIG. 2 is a bottom view of the TAB tape of FIG. 1.

FIGS. 1 and 2 show a semiconductor device according to the first embodiment of the present invention. The semiconductor device 10 comprises a semiconductor chip 12, a TAB tape for mounting the semiconductor chip 12 thereto, and an adhesive resin layer 16 interposed between the semiconductor chip 12 and the TAB tape 14. The adhesive resin layer 16 includes a buffer sheet 18 for reducing the stress occurring due to the difference in the coefficient of thermal expansion between the semiconductor chip 12 and the TAB tape 14, and a die bonding material 20 for fixing the semiconductor chip 12 to the TAB tape 14 through the buffer sheet 18. In the fabrication, the buffer sheet 18 is attached to the TAB tape 14, the die bonding material 20 is applied to the buffer sheet 18, and the semiconductor chip 12 is fixed to the TAB tape 14.

The TAB tape 14 has bonding pads 22 of copper and ball pads 24 of copper. The bonding pads 22 and the ball pads 24 are interconnected by a wiring pattern (not shown) in the TAB tape 14. The electrodes of the semiconductor chip 12 are connected to the bonding pads 22 of the TAB tape 14 by wires 26.

Solder balls 28 are attached to the ball pads 24 of the TAB tape 14, to function as external electrodes. Accordingly, the semiconductor chip 12 and the solder balls 28 are electrically connected to each other with the TAB tape 14 as an interposer. The ball pads 24 are arranged on the upper surface of the TAB tape 14, and the TAB tape 14 has ball mounting holes 30 for mounting the solder balls 28. The solder balls 28 pass through the ball mounting holes 30, so that the upper ends of the solder balls 28 are secured to the ball pads 24 and the lower ends thereof protrude downward from the TAB tape 14.

Further, vapor escaping holes 32 are formed through the TAB tape 14 in such a manner as to reach the buffer sheet 18 and the die bonding material 20. Furthermore, the semiconductor device includes a sealing resin 34 for sealing the semiconductor chip 12.

The TAB tape 14 is of a structure having a plurality of polyimide film layers bonded to each other by an epoxy adhesive. The ball mounting holes 30 are formed in the TAB tape 14 in advance by laser beam, punching, drilling, etching, or other means. The vapor escaping holes 32, on the other hand, are not formed in advance in the TAB tape 14, but are formed, at least after the semiconductor chip 12 is mounted to the TAB tape 14, in such a manner as to pass through the TAB tape 14 and reach the buffer sheet 18 and the die bonding material 20.

Figure 3:
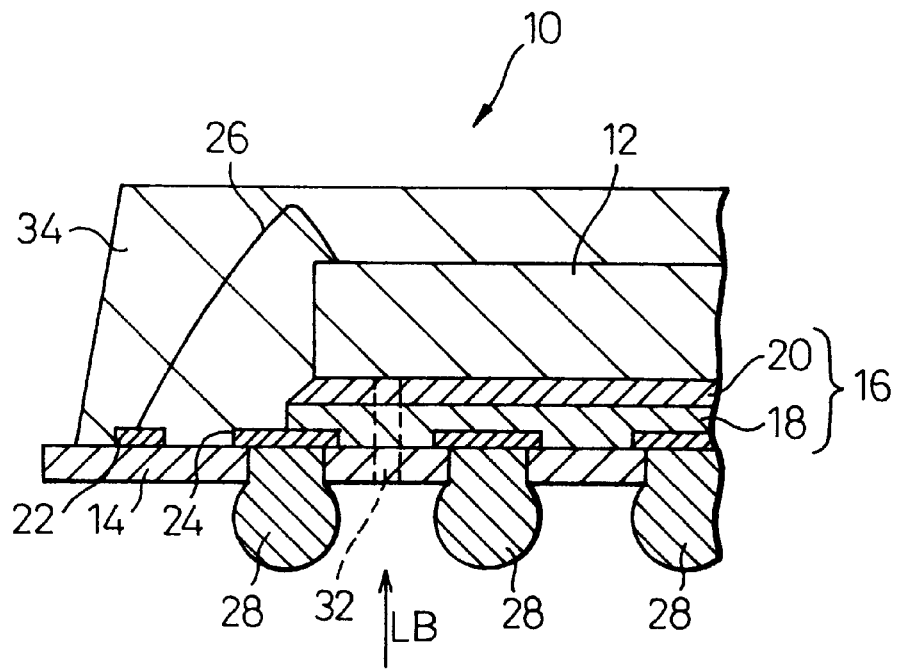
FIG. 3 is a cross-sectional view of the semiconductor device, illustrating the manner in which vapor escaping holes are formed in the TAB tape after the semiconductor device is fabricated.

FIG. 3 illustrates a method of fabricating the semiconductor device 10 of FIG. 1. The basic process for fabricating the semiconductor device 10 is well known and will be described only briefly. The buffer sheet 18 is attached to the TAB tape 14, the die bonding material 20 is applied to the buffer sheet 18, and the semiconductor chip 12 is fixed to the TAB tape 14. The electrodes of the semiconductor chip 12 are connected to the bonding pads 22 of the TAB tape 14 by the wires 26. A transfer mold is carried out to seal the semiconductor chip 12 by the sealing resin 34. Then, the solder balls 28 are secured to the ball pads 24 of the TAB tape 14.

After that, as shown in FIG. 3, the vapor escaping holes 32 are formed by a laser beam (LB) so as to extend through the TAB tape 14 and to reach the buffer sheet member 18 and the die bonding material 20. The TAB tape 14 is then cut into pieces corresponding to individual chips. The vapor escaping holes 32 can be formed before or after securing the solder balls 28, or after cutting the TAB tape 14, with the result that the identical effect can be obtained.

Figure 4:
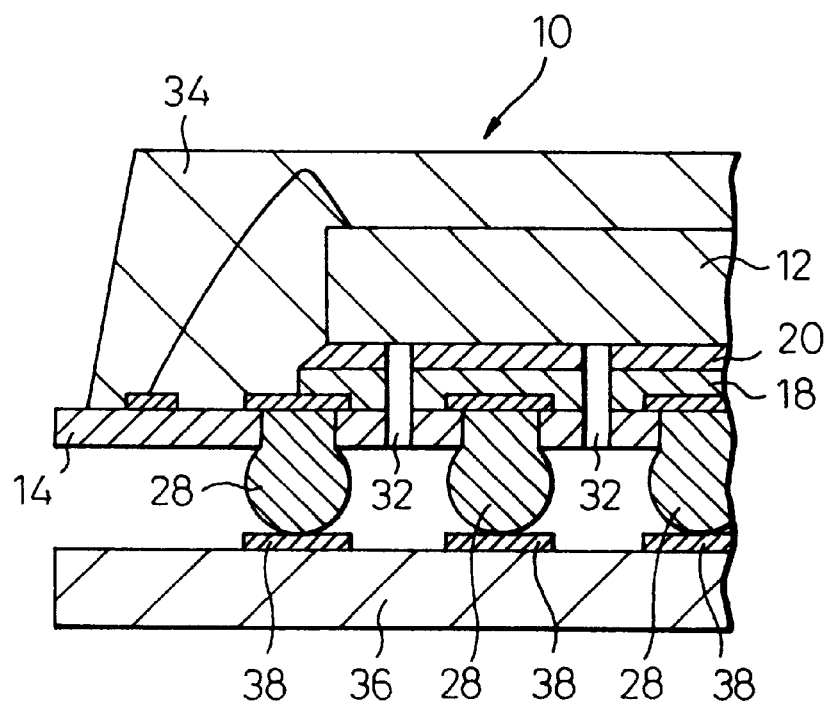
FIG. 4 is a cross-sectional view of the semiconductor device of FIG. 1 and the mother board to which the semiconductor device is mounted.

FIG. 4 shows an example of surface-mounting the semiconductor device 10 to the motherboard 36. In this case, at least the solder balls 28 are heated to reflow, so that the solder balls 28 are fused to the electrode pads 38 of the motherboard 36. In the case where the semiconductor device 10 of surface-mounting type such as a BGA or CSP semiconductor device having the solder balls 28 as external terminals is mounted to the motherboard 36, in general, the semiconductor device 10 is heated in a reflow equipment having the ambient temperature of about 250° C. to thereby connect the melted solder balls 28 to the electrode pads 38 of the motherboard 36.

In the solder reflowing, the moisture contained in the TAB tape 14, the buffer sheet 18, the die bonding material 20 and the sealing resin 34 of the semiconductor device 10 is heated, and the resulting vapor is released out of the semiconductor device 10 through the vapor escape holes 32. Since the vapor is released out of the semiconductor device 10 through the vapor escaping holes 32, the semiconductor device 10 is prevented from cracking and bulging.

If the vapor escaping holes 32 are preformed in the TAB tape 14, a material of one or more of the buffer sheet 18, the die bonding material 20 and the sealing resin 34 flows and leaks through the vapor escape holes 32 or fills up the vapor escape holes 32 during the heat treatment or the like step during the fabrication process of the semiconductor device 10, so that the vapor escaping holes 32 fail to function to release the vapor. In the present invention, since the vapor escaping holes 32 are formed after the semiconductor device 10 is formed (or preferably, after the step of sealing the semiconductor chip 12 by the sealing resin 34 ), a material of the buffer sheet 18, the die bonding material 20 and/or the sealing resin 34 does not leak through the vapor escaping holes 32 nor fill up the vapor escaping holes 32, and the vapor escaping holes 32 thus can perform the function of releasing the vapor when the solder balls are reflowed. Accordingly, cracking and/or bulging of the semiconductor device, which otherwise might occur at the time of solder reflowing, are prevented, and it is possible to fabricate a BGA or CSP package having superior thermal resistance in the solder reflowing process after moisture is absorbed.

It is possible to form a multiplicity of minute vapor escaping holes 32 at high speed and with high accuracy using a laser beam, as shown in FIG. 2. It is preferable to use a secondary high harmonic component of the YAG laser beam. The secondary high harmonic component of the YAG laser beam has a wavelength of 0.532 $\mu$m. A laser beam having a wavelength longer than 1 $\mu$m can pass through the semiconductor chip 12 and may destroy the component elements (such as a transistor) of the semiconductor chip 12, so it is not suitable for use in the present invention. Incidentally, the wavelength of the carbon dioxide gas laser beam is 10.6 $\mu$m, the wavelength of the YAG laser beam 1.06 $\mu$m, and the wavelength of the excimer laser beam 0.248 $\mu$m.

In FIG. 1, the vapor escaping holes 32 are formed in such a depth as to extend substantially through the die bonding material 20 and reach the back surface of the semiconductor chip 12. However, the vapor escaping holes 32 are not necessarily so deep as to reach the back surface of the semiconductor chip 12. Actually, the component members (the TAB tape 14, the buffer sheet 18, the die bonding material 20 and the sealing resin 34) have different cohesive force and different water permeabilities, and therefore the depth of the vapor escaping holes 32 should be determined taking such properties into account.

Table 1 below shows the result of the experiment of thermal resistance in the solder reflowing process of products having vapor escaping holes 32 by formed laser beam (referred to as laser holes).

TABLE 1

|  | Laser Hole Diameter | Hole Spec. Hole Pitch | Hole Number | Number of PKG Bulges | |
| --- | --- | --- | --- | --- | --- |
|  | (mm) | (mm) | ber | 24H | 48H |
| Sample No. 1 | 0.1 | 0.8 | 100 | 0/15 | 0/39 |
| Sample No. 2 | 0.1 | 1.2 | 49 | 0/15 | 0/39 |
| Sample No. 3 | 0.1 | 1.6 | 25 | 0/15 | 0/39 |
| Comparative sample 1 | — | No hole | — | 15/15 | — |

The thermal resistant test is carried out with respect to samples in the form of tape-type BGAs (package size 16□) having 224 pins at the pitch of 0.8 mm. Sample Nos. 1 to 3 have laser holes which are different in number, and comparative samples have no laser holes. Specifically, as shown in FIG. 2, samples are prepared, with vapor escape holes 32 having a diameter of 0.1 mm $\phi$ formed by the secondary high harmonic component of a YAG laser beam in the central portion in the back surface of the 224-pin tape-type BGA. In this experiment, the samples have three different numbers of holes, i.e. 100, 49, 25 and the hole depth set to reach the die bonding material 20, and the holes are formed after attaching balls to the tape and cutting the tape.

These samples (samples Nos.1 to 3) according to the invention and the comparative sample 1 having no holes are maintained in an atmosphere of 85° C. in temperature and 85% in humidity for 24 hours and 48 hours, and the IR reflow is then conducted (at the reflow temperature of 250° C. for about 10 seconds). Then, the bulging of the semiconductor devices (PKGs) is observed. As a result, as shown in Table 1, the samples of the semiconductor device having through holes do not exhibit bulging even after being held for 48 hours in the test atmosphere, but all the samples of the semiconductor devices having no holes exhibit bulging after being held for only 24 hours in the test atmosphere.

Figure 5:
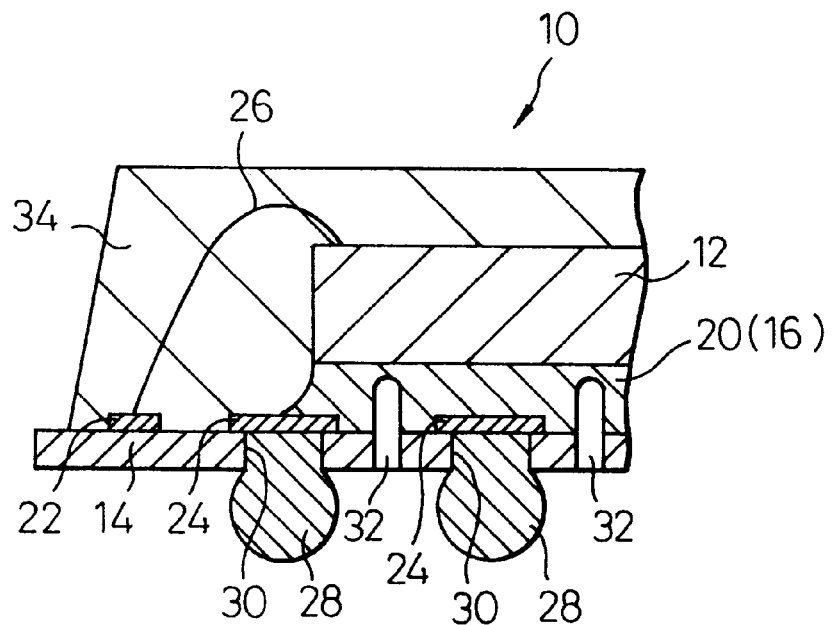
FIG. 5 is a cross-sectional view of the semiconductor device according to the second embodiment of the invention.

FIG. 5 shows a semiconductor device according to the second embodiment of the invention. The semiconductor device 10 comprises a semiconductor chip 12, a TAB tape 14 for mounting the semiconductor chip 12 thereto, and an adhesive resin layer 16 interposed between the semiconductor chip 12 and the TAB tape 14. In this embodiment, the buffer sheet 18 of the first embodiment shown in FIG. 1 is not provided and the adhesive resin layer 16 includes a die bonding material 20 for fixing the semiconductor chip 12 to the TAB tape 14.

In the fabrication process, the die bonding material 20 is applied to the TAB tape 14 and the semiconductor chip 12 is secured by the TAB tape 14. The remaining parts are substantially the same as the corresponding parts of the embodiment shown in FIG. 1. Also, like the embodiment shown in FIG. 1, the vapor escape holes 32 are formed through the TAB tape 14 so as to reach the die bonding material 20. The vapor escape holes 32, do not reach the back surface of the semiconductor chip 12.

The semiconductor device 10 according to this embodiment is fabricated by the same steps as in the fabrication method of the embodiment shown in FIG. 1, except that the step of bonding the buffer sheet 18 in the embodiment of FIG. 1 is omitted. Also, the operation of this embodiment is similar to that of the embodiment shown in FIG. 1.

Figure 6:
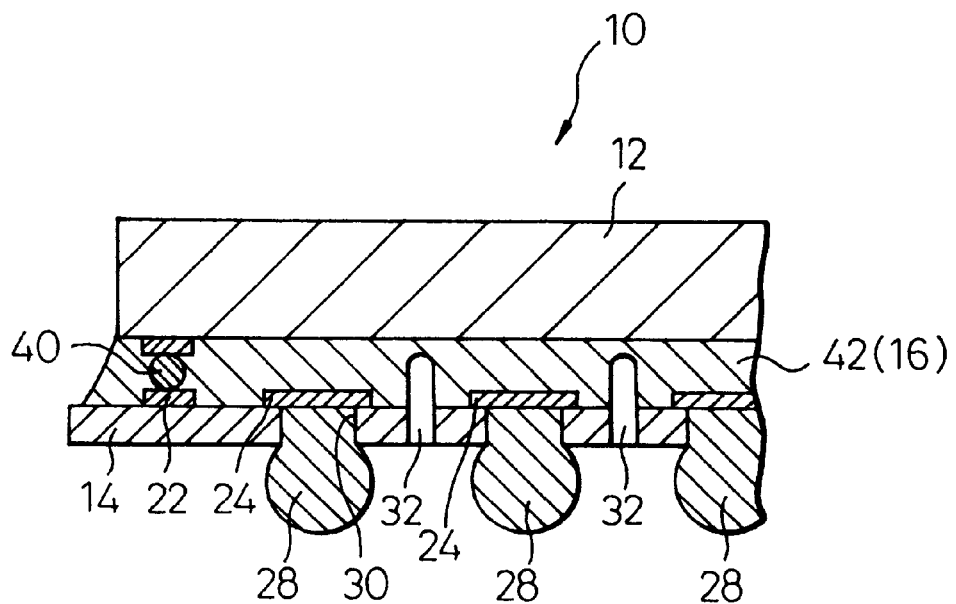
FIG. 6 is a cross-sectional view of the semiconductor device according to the third embodiment of the invention.

FIG. 6 shows a semiconductor device according to the third embodiment of the present invention. The semiconductor device 10 comprises a semiconductor chip 12, a TAB tape 14 for mounting the semiconductor chip 12 thereto, and an adhesive resin layer 16 interposed between the semiconductor chip 12 and the TAB tape 14. This embodiment represents in an example in which the invention is applied to a BGA or CSP package of tape type, connected by a flip chip method. The semiconductor chip 12 includes protruding electrodes 40 which are connected to bonding pads 22 of the TAB tape 14. After the protruding electrodes 40 are connected to the bonding pads 22, an under-filling material 42 is filled between the semiconductor chip 12 and the TAB tape 14. This under-filling material 42 constitutes the adhesive resin layer 16. The semiconductor chip 12 can be sealed with a sealing resin.

After the under-filling material 42 is filled and set, vapor escape holes 32 are formed through the TAB tape 14 in such a manner as to reach the under-filling material 42. The vapor escaping holes 32 do not reach the back surface of the semiconductor chip 12. The vapor escape holes 32 function as escape paths of the water vapor when the solder is reflowed and can prevent the package from cracking and bulging which might otherwise occur at the time of solder reflowing. The under-filling material 42 is prevented from leaking out, through the vapor escaping holes 32, by conducting the step of forming the vapor escape holes 32 after the under-filling material 42 is filled and set. Since the flip-chip method involves face-down bonding, and the front surface of the semiconductor chip 12 faces the TAB tape 14, it is necessary to control the depth of the holes formed by a laser beam so that the holes do not reach the front surface of the semiconductor chip 12 but terminate within the under-filling material 42.

Figure 7:
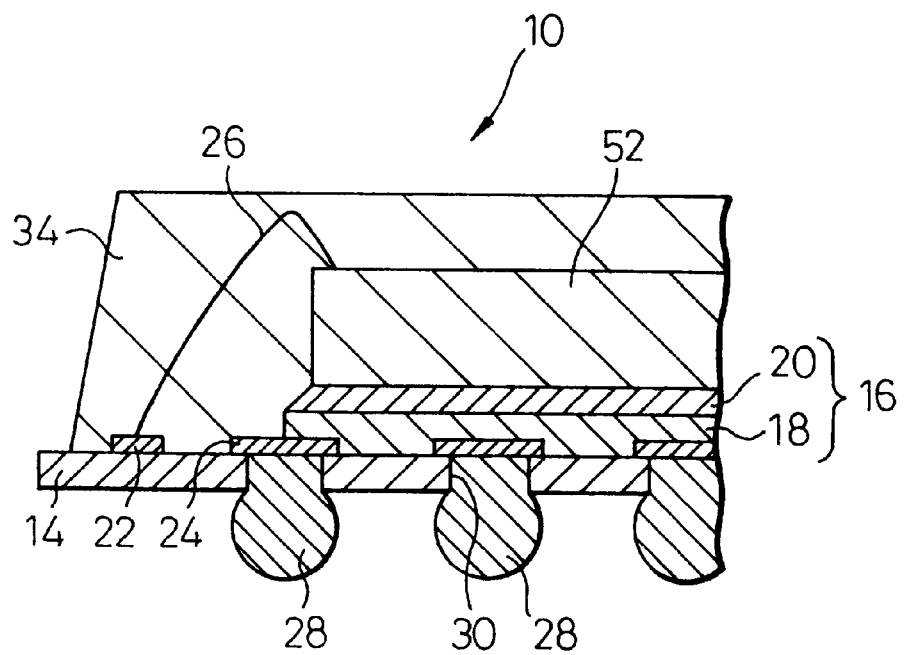
FIG. 7 is a cross-sectional view of the semiconductor device according to the fourth embodiment of the invention.

FIG. 7 shows a semiconductor device according to the fourth embodiment. Like in the embodiment of FIG. 1, the semiconductor device 10 according to this embodiment comprises a semiconductor chip 12, a TAB tape 14 for mounting the semiconductor chip 12 thereto, and an adhesive resin layer 16 interposed between the semiconductor chip 12 and the TAB tape 14. The adhesive resin layer 16 includes a buffer sheet 18 and a die bonding material 20.

The TAB tape 14 includes bonding pads 22 and ball pads 24, and the electrodes of the semiconductor chip 12 are connected to the bonding pads 22 of the TAB tape 14 by wires 26. The solder balls 28 are attached to the ball pads 24 of the TAB tape 14, and function as external electrodes. Further, the semiconductor device comprises a sealing resin 34 for sealing the semiconductor chip 12.

In this embodiment, the vapor escape holes 32 are not formed unlike the embodiment shown in FIG. 1, but instead, the TAB tape 14 is made of polyimide having high water permeability (water vapor permeability) in order to prevent the cracking and bulging of the semiconductor device which otherwise might occur when the solder is reflowed after the device absorbs moisture. Preferably, the TAB tape 14 is made of polyimide resin having water permeability of not less than 10 g/m$^2$·24H. In this way, it is possible to provide the polyimide base material with a similar effect to that of the vapor escape holes 32 of the embodiment shown in FIG. 1, by using polyimide having high water permeability as the base film of the TAB tape 14. It is thus possible to produce a tape-type BGA or CSP package well resistant to the reflowing.

Table 2 below shows the result of thermal resistance test in the solder reflowing process of the semiconductor device (package) 10, using TAB tapes 14 having various levels of water permeability.

TABLE 2

| | Sample Spec. Thickness ($\mu$m) | Water Permeability (g/m$^2$ · 24H) | Number of PKG Bulging | |
|---|---|---|---|---|
| | | | 24H | 48H |
| Sample No. 4 | 40 | 108.0 | 0/10 | 0/10 |
| Sample No. 5 | 50 | 14.5 | 0/18 | 0/18 |
| Comparative Sample 2 | 50 | 1.5 | 15/15 | 0/18 |

The samples are FBGA having 288 pins (0.75 mm pitches and package size 18☐). The test conditions are the same as conditions in the case of Table 1, i.e. THS (85° C./85%, 24H, 48H)+IR (250° C. Max 10 sec).

Sample No.4 is a double-layered TAB tape 14 using Espanex Type SC18-40 from Shin-Nittetsu Chemical Industrial Co., Ltd. as the base film. The water permeability of sample No.4 is 108.0, which is 72 times as high as that of the comparative sample 2. The water permeability of the TAB tape 14 using Espanex having the thickness of 50 $\mu$m is 86.4 (58 times as high as that of the comparative sample 2).

Sample No.5 is the TAB tape 14 made of Capton Type 200EN from Toray•Dupont Corporation. The water permeability of sample No.5 is 14.5, which is 10 times as high as that of the comparative sample 2. Sample No.6 in Table 3 below is the TAB tape 14 using Capton Type 200V. This material has water permeability of 37.3 (25 times as high as that of the comparative sample).

The comparative sample 2 is a three-layered TAB tape 14 using Upilex Type 50S from Ube Industries, Ltd. as a base film. The conventional TAB tape 14 is made of Upilex in many cases.

The water permeability (water vapor permeability) is tested by the method called Mocon method, using the equipment called PERMATRAN-WID of Mocon. The Mocon method is the water vapor permeability testing method, using an infrared sensor, based on JIS K7128 or ASTM F1249.

The test is conducted in a manner similar to the first embodiment. Specifically, the samples are maintained in an ambiente of 85° C./85% for 24 hours and 48 hours and the IR reflow was conducted at the temperature of 250° C. for about 10 seconds. Then, the bulging of the package is checked. The samples including the TAB tapes using polyimide having high in water permeability (water vapor permeability) as a base film do not show any package bulging even after being allowed to stand for 48 hours in the ambiente of 85° C./85%, although vapor escaping holes are not formed.

TABLE 3

|  | Water Permeability | Number of PKG bulging | | | |
|---|---|---|---|---|---|
|  |  | 1st test | 2nd test | 3rd test | Total |
| Sample No. 5 | 14.5 | 0/47 | 1/47 | 0/46 | 1/47 |
| Sample No. 6 | 37.3 | 0/41 | 0/41 | 0/41 | 0/41 |
| Comparative Sample 2 | 1.5 | 36/39 | 3/3 | — | 39/39 |

The samples are FBGA of 48 pins (0.8 mm pitch, package size 6×9). The test conditions are three sets of THS {(85° C./85%, 24H)+IR (250° C. Max 10 sec)}.

The result in Tables 2 and 3 shows that the cracking and the bulging of the semiconductor devices which otherwise might occur at the time of solder reflow after the devices absorbs moisture can be prevented by producing the TAB tape 14 of polyimide having high water permeability, even if the vapor escaping holes 32 in the first embodiment are not formed. As seen from Tables 2 and 3, sample No.5 having water permeability of 14.5 produced a satisfactory result. This indicates that the recommendable water permeability of the TAB tape 14 is 10 or more.

Figure 8:
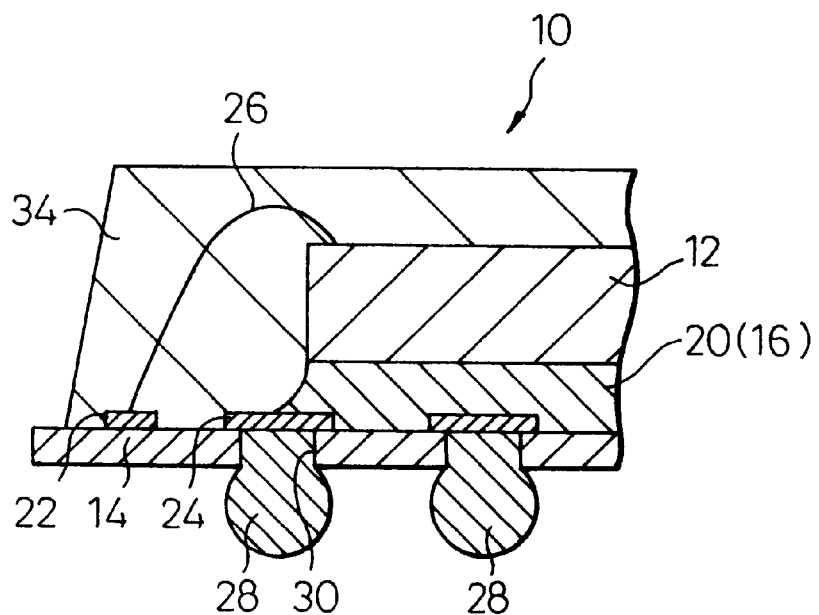
FIG. 8 is a cross-sectional view of the semiconductor device according to the fifth embodiment of the invention.

FIG. 8 shows a semiconductor device according to the fifth embodiment of the present invention. The semiconductor device 10 comprises a semiconductor chip 12, a TAB tape 14 for mounting the semiconductor chip 12 thereto, and an adhesive resin layer 16 interposed between the semiconductor chip 12 and the TAB tape 14. In this embodiment, the buffer sheet 18 in the embodiment of FIG. 7 is omitted, and the adhesive resin layer 16 comprises a die bonding material 20 for fixing the semiconductor chip 12 to the TAB tape 14. The TAB tape 14, like the TAB tape 14 of FIG. 7, is made of polyimide having high water permeability. Therefore, the function of the semiconductor device of FIG. 8 is similar to that of the embodiment shown in FIG. 7.

FIG. 9 shows a semiconductor device according to the sixth embodiment of the invention. The semiconductor device 10 comprises a semiconductor chip 12, a TAB tape 14 for mounting the semiconductor chip 12 thereto, and an adhesive resin layer 16 interposed between the semiconductor chip 12 and the TAB tape 14. This embodiment is an example in which the invention is applied to a BGA or CSP package of tape type, connected by a flip chip method. The semiconductor chip 12 has protruding electrodes 40 which are connected to bonding pads 22 of the TAB tape 14. After the protruding electrodes 40 are connected to the bonding pads 22, an under-filling material 42 is filled between the semiconductor chip 12 and the TAB tape 14. This under-filling material 42 constitutes the adhesive resin layer 16. The TAB tape 14 is made of polyimide having high water permeability, like the TAB tape 14 of FIG. 7. Consequently, the semiconductor device of FIG. 9 functions in a way similar to the embodiment of FIG. 7.

As described above, according to the present invention, since at least one hole is formed through the tape, the moisture contained in the semiconductor device is released by the hole when the solder balls are reflowed, and the semiconductor device is prevented from cracking and bulging. Since the at least one hole is formed after the step of fixing the semiconductor chip to the tape by the adhesive resin layer, the hole is not filled up with the adhesive resin layer flowing by heat treatment during the semiconductor fabrication process and thus effectively functions as a water vapor escape hole.

Also, in order to provide a similar effect to the through hole, by using a TAB tape using polyimide base layer having high water permeability, a BGA or CSP package of a tape type having superior resistance to the reflowing procedure can be produced, even without forming a through hole.

What is claimed is:

1. A semiconductor device comprising a semiconductor chip, a tape for mounting said semiconductor chip thereto, an adhesive resin layer interposed between said semiconductor chip and said tape, and solder balls passing through ball mounting holes arranged on said tape, characterized in that said tape and said adhesive resin layer have at least one vapor escaping hole, in addition to said ball mounting holes, extending through said tape and reaching said adhesive resin layer.

2. A semiconductor device according to claim 1, further comprising a sealing resin for sealing said semiconductor chip, said adhesive resin layer comprising a die bonding material for fixing said semiconductor chip to said tape.

3. A semiconductor device according to claim 1, further comprising a sealing resin for sealing said semiconductor chip, said adhesive resin layer comprising a buffer material for reducing a stress occurring due to the difference in coefficient of thermal expansion between said semiconductor chip and said tape, and a die bonding material for fixing said semiconductor chip to said tape through said buffer.

4. A semiconductor device according to claim 1, characterized in that said semiconductor chip is connected to said tape by protruded electrodes, and said adhesive resin layer is made of an under-filling material filled between said semiconductor chip and said tape.

5. A semiconductor device according to claim 1, characterized in that said tape is a FPC tape.

* * * * *